(12) United States Patent
Moser et al.

(10) Patent No.: US 10,825,716 B2
(45) Date of Patent: Nov. 3, 2020

(54) METHOD FOR MANUFACTURING A SEMICONDUCTOR DEVICE

(71) Applicant: Infineon Technologies AG, Neubiberg (DE)

(72) Inventors: Andreas Moser, Maria-Rain (AT); Matteo Dainese, Villach (AT); Matthias Kuenle, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/192,277

(22) Filed: Nov. 15, 2018

(65) Prior Publication Data

US 2019/0148217 A1 May 16, 2019

(30) Foreign Application Priority Data

Nov. 16, 2017 (DE) .......... 10 2017 127 010

(51) Int. Cl.

| H01L 21/02 | (2006.01) |
|---|---|
| H01L 21/78 | (2006.01) |
| H01L 21/762 | (2006.01) |
| H01L 21/324 | (2006.01) |
| H01L 21/683 | (2006.01) |

(Continued)

(52) U.S. Cl.
CPC .... *H01L 21/76224* (2013.01); *H01L 21/0228* (2013.01); *H01L 21/02274* (2013.01); *H01L 21/324* (2013.01); *H01L 21/6835* (2013.01); *H01L 21/78* (2013.01); *H01L 24/00* (2013.01); *H01L 29/73* (2013.01); *H01L 29/7393* (2013.01)

(58) Field of Classification Search
CPC ......... H01L 21/76224; H01L 21/02274; H01L 21/0228; H01L 21/324; H01L 21/78
USPC ....................................................... 257/620
See application file for complete search history.

(56) References Cited

U.S. PATENT DOCUMENTS

| 4,725,561 A | 2/1988 | Haond et al. |
| 2002/0119607 A1* | 8/2002 | Miyasaka ............... C23C 14/10 438/151 |

(Continued)

FOREIGN PATENT DOCUMENTS

DE  102015101977 A1  8/2015

*Primary Examiner* — Tong-Ho Kim
(74) *Attorney, Agent, or Firm* — Murphy, Bilak & Homiller, PLLC (57) ABSTRACT

An embodiment of a method for manufacturing a semiconductor device includes: providing a monocrystalline semiconductor substrate having a first side; forming a plurality of recess structures in the semiconductor substrate at the first side; filling the recess structures with a dielectric material to form dielectric islands in the recess structures; forming a semiconductor layer on the first side of the semiconductor substrate to cover the dielectric islands; and subjecting the semiconductor layer to heat treatment and recrystallizing the semiconductor layer to form a recrystallized semiconductor layer, so that a crystal structure of the recrystallized semiconductor layer adapts to a crystal structure of the semiconductor substrate, and so that the semiconductor substrate and the semiconductor layer together form a compound wafer with the dielectric islands at least partially buried in the semiconductor material of the compound wafer.

17 Claims, 5 Drawing Sheets

(51) Int. Cl.
*H01L 23/00* (2006.01)
*H01L 29/73* (2006.01)
*H01L 29/739* (2006.01)

(56) References Cited

U.S. PATENT DOCUMENTS

2015/0236142 A1* 8/2015 Laven ................. H01L 21/2254
257/66
2015/0294901 A1* 10/2015 Carothers ......... H01L 21/76267
438/425

* cited by examiner

METHOD FOR MANUFACTURING A SEMICONDUCTOR DEVICE

TECHNICAL FIELD

Embodiments described herein relate to methods for forming a semiconductor device. Furthermore, this specification refers to embodiments of compound wafers with semiconductor devices, for example FETs, IGBTs, DMOS, Bipolar transistors, Diodes, or Thyristors with an improved wafer processing.

BACKGROUND

Semiconductor devices are manufactured on wafers which provide mechanical stability during the process of forming a semiconductor device. The wafer can be at least partially removed at the end of the manufacture process.

For example, a semiconductor device layer into which semiconductor devices are to be integrated may be detached from a carrier wafer after at least partially integrating the semiconductor devices. Other approaches removes the carrier wafer by grinding or etching. In any case, the detachment or removal should be at well controlled to avoid that the semiconductor device layer is damaged.

In view thereof, there is need for further improvement.

SUMMARY

According to an embodiment, a method for manufacturing a semiconductor device includes: providing a monocrystalline semiconductor substrate having a first side; forming a plurality of recess structures in the semiconductor substrate at the first side; filling the recess structures with a dielectric material to form dielectric islands in the recess structures; forming a semiconductor layer on the first side of the semiconductor substrate to cover the dielectric islands; and at subjecting the semiconductor layer to a heat treatment and recrystallizing the semiconductor layer, wherein the crystal structure of the recrystallized semiconductor layer adapts to the crystal structure of the semiconductor substrate. The semiconductor substrate and the semiconductor layer form together a compound wafer with the dielectric islands at least partially buried in the semiconductor material of the compound wafer.

According to an embodiment, a compound wafer includes: a monocrystalline semiconductor body having a first side and a second side; dielectric islands formed at the second side of the semiconductor body; one or more doping regions in the semiconductor body for at least one pn-junction; and a metallization on the second side in direct contact with the semiconductor body and the dielectric islands.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical", "under", "below", "lower", "over", "upper" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

The components in the Figures are not necessarily to scale, instead emphasis being placed upon illustrating the principles of the invention. Moreover, in the Figures, like reference signs designate corresponding parts.

The terms "electrical connection" and "electrically connected" and "in contact" intend to describe an Ohmic connection between two features.

FIGS. 1A to 1I illustrate a process of forming a semiconductor device.

According to an embodiment, a monocrystalline semiconductor substrate 10 having a first side 11 is provided. A plurality of recess structures 12a may be formed in the semiconductor substrate 10 at the first side 11. The recess structures 12a may be filled with a dielectric material to form dielectric islands 12 in the recess structures 12a. A semiconductor layer 13 can be formed on the first side 11 of the semiconductor substrate 10 to cover the dielectric islands 12. The semiconductor layer 12 can be heated to cause recrystallization, wherein the crystal structure of the recrystallized semiconductor layer 10 adapts to the crystal structure of the semiconductor substrate. The semiconductor substrate 10 and the semiconductor layer 13 form together a compound wafer with the dielectric islands 12 at least partially buried in the semiconductor material of the compound wafer 14.

Figure 1A:
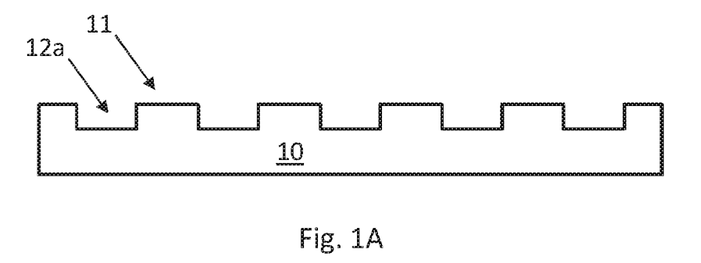
FIGS. 1A to 1I illustrate processes according to an embodiment.

In FIG. 1A, a semiconductor substrate 10 having a first side 11 is provided. The semiconductor substrate 10 can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used. In the present embodiment, the semiconductor material is Si.

A plurality of recess structures 12a can be formed in the semiconductor substrate 10 at the first side 11. The recess structures 12a can be formed, for example, by etching. The recess structures 12a are shown in FIG. 1A. The recess structures 12a can be for example trenches or holes. According to an embodiment the recess structures 12a includes a plurality of trenches or holes in a horizontal alignment in one or two directions. An exemplary embodiment includes a plurality of elongated trenches 12a which run parallel to each other. The trenches 12a can be arranged at a given pitch in lateral direction, defined perpendicular to the elongated extension of the trenches 12a. It is also possible to arrange the trenches 12a at varying distances so that, for example, adjacent trenches being spaced from each other at different distances can be provided. In further embodiments, the recess structures 12a can be spaced apart holes with constant or varying distances between adjacent holes. In other embodiments, the recess structures 12a includes differently shaped recess structures 12a such as trenches and holes, or trenches and holes with different width. Other geometrical structures are also possible.

According to an embodiment, each trench or hole of the recess structure 12a can have a lateral (horizontal) size or width, which is illustrated from right to left in FIG. 1A to 1I, of 100 nm to 10 µm, such as 1 µm to 5 µm. According to an embodiment, the size can be between 200 nm and 3 µm, such as between 200 nm and 2 µm. The sizes of the trenches or holes can be equal or different. In case of trenches forming the recess structures 12a, the lateral size refers to the width of the trenches, i.e. the width perpendicular to the elongation of the trenches, when seen in plan projection onto the first side. According to an embodiment, the lateral size is selected to initiate re-crystallization of a semiconductor layer as described further below.

The lateral (horizontal) distance, also referred to as pitch, between two trenches can be in the range of 10 nm to 10 µm, such as about 30 nm to about 5 µm, for example about 50 nm to about 3 µm, or even about 100 nm to about 1 µm. The depth of a trench or hole in the thickness direction (vertical) can be in the range of about 100 nm to about 10 µm, for example about 500 nm to about 3 µm. The size of a trench or hole of the recess structure 12a and the lateral (horizontal) distance between two trenches can be adapted to each other in a way that the semiconductor layer to be formed on the first side 11 of the semiconductor substrate 10 to cover the dielectric islands 12 can recrystallize as a monocrystalline layer overbridging the dielectric islands 12 in the recess structure 12a.

Figure 1B:
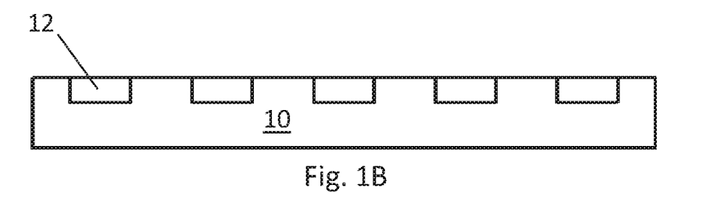

The recess structures 12a are filled with a dielectric material to form dielectric islands 12 in the recess structures 12a as shown in FIG. 1B. The dielectric material can be any material suitable for manufacturing semiconductor components. Examples of such materials include, without being limited thereto, silicon oxide ($SiO_2$) or silicon nitride ($Si_3N_4$). In the present embodiment, the dielectric material to form dielectric islands 12 is $SiO_2$.

According to an embodiment, the filling of the recess structures 12a with a dielectric material to form dielectric islands 12 in the recess structures 12a includes: filling of the recess structures 12a with a dielectric material; and planarizing the first side 11 of the semiconductor substrate 10. During the filling of the recess structure 12a, additional dielectric material may be formed on the first side 11 of the semiconductor substrate 10 between or next to the recess structures 12a. The planarization removes the additional dielectric material covering the first side 11 of the semiconductor substrate 10 to expose the semiconductor substrate 10 between the recess structures 12a. The planarizing can be done by polishing or other surface treatments.

The depth of the recess structures 12a may also define the vertical thickness of the dielectric islands 12. The lateral width, the pitch and the depth of the recess structures 12a can be adapted so that, after planarization, a common surface formed by the dielectric islands 12 and the semiconductor material of the semiconductor substrate 10 extending between the spaced apart dielectric islands 12 is substantially even.

According to an embodiment, the method further includes: polishing the first side 11 after forming the dielectric islands 12 and prior to forming the semiconductor layer 13.

According to an embodiment, the dielectric islands 12 are spaced-apart and separated from each other by semiconductor material of the semiconductor substrate 10. The semiconductor substrate 10 extends to and partially forms the common surface. The dielectric islands 12 extends from the common surface into a given depth of the semiconductor substrate 10. For example, trenches running parallel to each other are filled with dielectric material to form elongated dielectric islands, wherein the dielectric islands 12 are separated by the material of the semiconductor substrate 10. The dielectric islands 12 are in contact with the semiconductor substrate 10 in lateral direction and a bottom side.

Figure 1C:
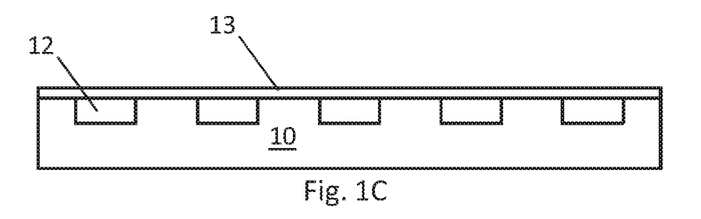

FIG. 1C illustrates the forming of a semiconductor layer 13 on the first side 11 of the semiconductor substrate 10 to cover the dielectric islands 12. The semiconductor layer 13 can be formed in contact with the semiconductor substrate 10 and the dielectric islands 12. The semiconductor layer 13 can be polycrystalline or amorphous. According to an embodiment, the dielectric islands 12 are completely covered by either the semiconductor substrate 10 or the semiconductor layer 13. The dielectric islands 12 can be described as buried in a compound wafer which includes the semiconductor substrate 10, the semiconductor layer 13 and the dielectric islands 12 buried therein.

According to an embodiment, the semiconductor layer 13 is formed as amorphous or as polycrystalline layer on and in contact with the semiconductor substrate 10 and the dielectric islands 12.

According to an embodiment, the semiconductor layer 13 may be comprised of or consists of the same semiconductor material as the semiconductor substrate 10. However, the crystalline structure of the semiconductor material of the semiconductor layer 13 and of the semiconductor material of the semiconductor substrate 10 can differ. For example, amorphous or polycrystalline material can be formed easier than mono-crystalline material. In the present embodiment, the material of the semiconductor layer 13 is amorphous or polycrystalline Si and the semiconductor substrate 10 is monocrystalline Si.

According to an embodiment, the semiconductor layer 13 is formed as amorphous or as polycrystalline layer on and in contact with the semiconductor substrate 10 and the dielectric islands 12. The semiconductor layer can be, for example, deposited by CVD (chemical vapor deposition) or HDP CVD (High Density Plasma Chemical Vapor Deposition). Other deposition processes can be used as well. Deposition processes fills the recess structures 12a without consuming the material of the semiconductor substrate as, for example, processes which includes oxidation of semiconductor material.

According to an embodiment, the semiconductor layer 13 has a thickness between 10 nm to 300 nm, such as 20 nm to 200 nm.

Figure 1D:
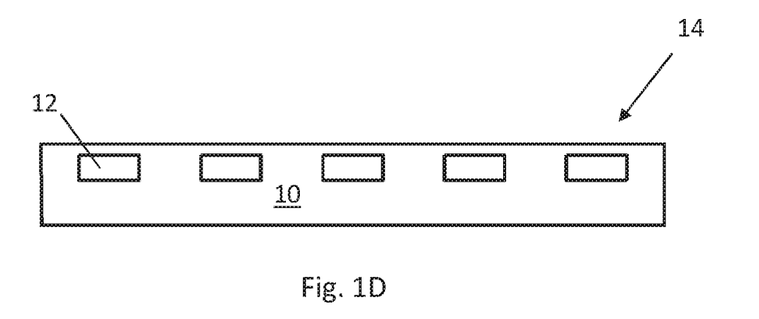

The method may further include subjecting the semiconductor layer to a heat treatment and recrystallizing the semiconductor layer 13 to form a semiconductor layer 13 having a crystalline structure, such as a mono-crystalline structure. Such layer may be referred to as recrystallized semiconductor layer. The crystallinity of the semiconductor layer 13 significantly improves by heating and recrystallizing, and may results in a substantially mono-crystalline recrystallized semiconductor layer 13. The crystal structure of the recrystallized semiconductor layer 13 adapts to the crystal structure of the monocrystalline semiconductor substrate 10 during recrystallization, so that both the recrystallized semiconductor layer 13 and the semiconductor substrate 10 have the same crystal structure and crystal lattice orientation. The semiconductor substrate 10 and the semiconductor layer 13 are forming together a compound wafer 14 with the dielectric islands 12 which are at least partially buried in the semiconductor material of the compound wafer 14. Heating and recrystallizing does not necessarily mean that the semiconductor layer 13 becomes fluid. The initial amorphous or poly-crystal structure of the semiconductor layer 13 may at least partially, typically completely, disappear and transformed into a more crystalline structure such as a monocrystalline structure. Due to the heating of the semiconductor layer 13, the material can recrystallize during a controlled vertical temperature profile. The crystal structure of the semiconductor layer 13 is adapted to the crystal structure of the semiconductor substrate 10 after the cooling down. In particularly, if both contain the same material, the recrystallized semiconductor layer 13 can have the same lattice constant and the same lattice orientation as the monocrystalline semiconductor substrate 10 resulting in a monocrystalline semiconductor layer 13.

For a controlled cooling, a substrate carrier such as a chuck can be used for holding the semiconductor substrate 10 during heating and recrystallizing. The substrate carrier can include cooling elements which can be controlled to impart a controlled cooling on the semiconductor substrate 10.

According to an embodiment, the heating of the semiconductor layer 13 includes: subjecting the semiconductor layer 13 to a laser treatment of sufficient energy to cause at least partial dissolving of the initial polycrystalline or amorphous structure of the semiconductor layer 13. The laser treatment produces local heating of the semiconductor layer 13 for the desired temperature. The energy of the laser treatment may dependent on the thickness of the semiconductor layer 13 and the material. An example for a laser treatment of a semiconductor layer 13 consisting of Si with a thickness 200 nm may employ laser energy of 1.0 J/cm$^2$ to 4.0 J/cm$^2$ on an area of for example 2 cm×2 cm. Another example for a laser treatment of a semiconductor layer 13 consisting of Si with a thickness 70 nm employs a laser energy of 0.1 J/cm$^2$ to 3 J/cm$^2$ on an area of for example 2 cm×2 cm. In the above examples, the semiconductor layer 13 were initially amorphous silicon. After the laser treatment, the recrystallized semiconductor layer 13 is substantially mono-crystalline.

A laser treatment, or laser anneal, supplies energy to the semiconductor layer 13 to allow re-organization of the internal structure of the semiconductor layer 13 resulting in a formation of a substantially mono-crystalline semiconductor layer 13. A complete melting is not needed, but may be beneficial as this will speed up the re-organization process. For example, the energy provided by the laser causes the semiconductor layer 13 to at least partially, typically to completely dissolve its crystal structure, so that the semiconductor material can crystallize using the underlying semiconductor substrate 10 as starting material. Upper portions of the semiconductor substrate 10 may also partially dissolve its crystal structure during laser treatment.

According to an embodiment, the local temperature of the semiconductor layer 13 during the heating is enough to dissolve the crystal structure of the semiconductor layer 13 and to cause recrystallization during a controlled temperature profile. The duration of this controlled temperature profile can influence the minimum necessary recrystallization temperature, wherein a longer duration combines with a lower temperature can have the same effect as a short duration with a higher temperature.

According to an embodiment, the temperature during the heating treatment is at least 1100° C., particularly at least 1150° C., such as at least 1180° C. or at least 1200° C. The recrystallization and reorganisation temperature depends on the material. The melting temperature, for example, of Si is 1414° C. It is not necessary that the semiconductor layer 13 is melted partially or completely.

According to an embodiment, the heating treatment includes at least a partial melting of the semiconductor layer 13.

According to an embodiment, the method further includes: forming a thin oxide layer on the semiconductor layer 13 prior to the heating treatment. A thin oxide layer can reduce the risk of bursting of the semiconductor layer 13 during the heating treatment.

According to an embodiment, the method further includes: subjecting the semiconductor layer 13 to an RF-H plasma treatment. The RF-H (Radio Frequency Hydrogen) plasma treatment implants Hydrogen ions into the semiconductor layer 13 which further reduces the recrystallization temperature of the semiconductor layer 13. Including an RF-H plasma treatment, the local temperature of the controlled temperature profile of a Si semiconductor layer 13 can be further reduced.

The resulting compound wafer 14 is shown in FIG. 1D. The compound wafer 14 includes at least partially buried dielectric islands 12. According to an embodiment, the semiconductor layer 13 and the semiconductor substrate 10 are formed of or consist of the same material. After recrystallizing of the semiconductor layer 13, the semiconductor substrate 10 and the semiconductor layer 13 typically cannot be distinguished between each other anymore. The transition between former semiconductor layer 13 and semiconductor substrate 10 is continuous without any sharp interface or any clearly visible interface. The compound wafer 14 is monocrystalline except of the buried dielectric islands 12.

The compound wafer 14 can be used as a substrate wafer for processing a semiconductor device as illustrated in FIGS. 1E to 1I. The compound wafer 14 provides mechanical stability during the processing of the semiconductor devices.

According to an embodiment, the thickness of the semiconductor layer 13, and therefore of the compound wafer 14, is increased. This can be done, for example, by epitaxial growth of an epitaxial layer 15. The epitaxial layer 15 can also be described as semiconductor device layer 15. The method can further include: increasing the thickness of the compound wafer 14 by forming an epitaxial layer 15 on the recrystallized semiconductor layer 13, wherein the recrystallized semiconductor layer 13 is used as a seed layer. FIGS. 1E to 1I illustrate the epitaxial layer 15 on the substrate 10 or on the recrystallized semiconductor layer 13, respectively. Due to an epitaxial growth, there is a continuous transition between the substrate 10 and the epitaxial layer 15.

Figure 1E:
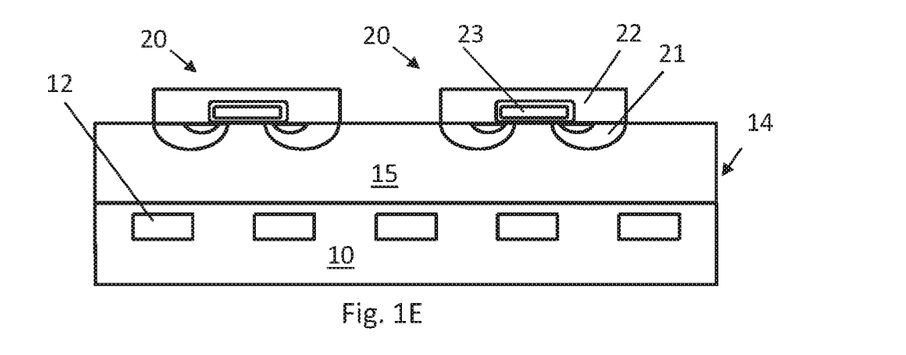

According to an embodiment, the method further includes: forming at least one pn-junction in the compound wafer 14. The pn-junction can be formed, for example, in the epitaxial layer 15 of the compound wafer 14.

According to an embodiment, the method further includes: forming a plurality of doping regions 21 in the epitaxial layer 15 to form a plurality of pn-junctions.

FIG. 1E illustrates an embodiment of the compound wafer 14 with the epitaxial layer 15 including a plurality of doping regions 21. The doping regions 21 can be one of n-type or p-type doping regions and adjacent doping regions of different types form pn-junction.

The compound wafer 14 of the embodiment of FIGS. 1E to 1I further includes semiconductor devices 20 that can be formed during front-end-of-line (FEOL) processing, wherein the semiconductor device 20 is an IGBT and includes an isolated gate 23 and a source electrode 22. The corresponding collector metallization is formed in FIG. 1H. The compound wafer 14 can include a plurality of semiconductor devices 20 for example 2 or 1000 or 1 million.

According to an embodiment, the semiconductor device 20 can include any suitable device, such as transistors, capacitors, resistors or, for example, IGBTs, CMOS, or FETs, MOSFETs. In particularly, the semiconductor device 20 can be a bipolar semiconductor device.

Figure 1F:
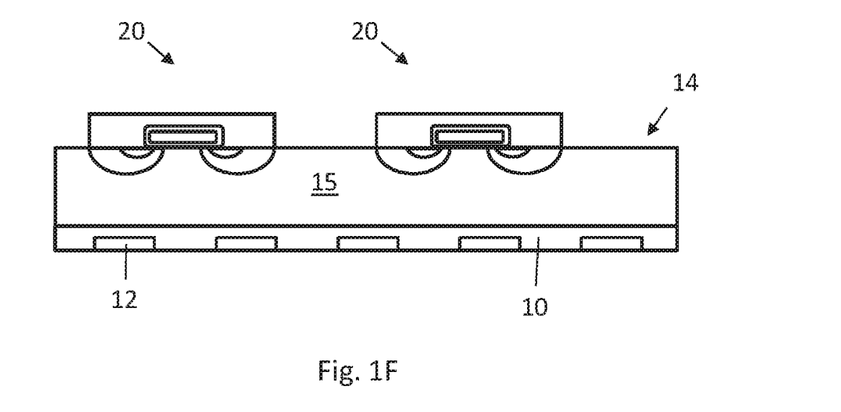

According to an embodiment, the method further includes: thinning the semiconductor substrate 10 of the compound wafer 14 on a second side opposite to the first side 11, wherein the thinning stops at the dielectric islands 12. The compound wafer 14 can be thinned by etching or polishing or a combination thereof (chemical-mechanical planarization). The etching process can be, for example, wet etching or plasma etching, wherein the process is adapted to the material of the compound wafer 14 and of the dielectric islands 12. The dielectric islands 12 include a different material than the substrate 10 which leads to different chemical and mechanical stability. The dielectric islands 12 can therefore be used as a stop for the thinning process.

According to an embodiment, the thinning process is adapted to the material of the dielectric islands 12 and of the substrate 10, wherein the dielectric islands 12 have a higher resistance to the thinning process than the substrate 10 and wherein the dielectric islands 12 are used as a mechanical stop for the thinning process. As illustrated in FIG. 1F, the higher resistance to the thinning process increases the necessary time for the thinning process. The dielectric islands 12 are located between the semiconductor device layer 15 and the second side of the compound wafer 14. The appropriate time window to stop the thinning process is therefore enlarged shortly before the thinning arrives at the semiconductor device layer 15. The larger time window to stop the thinning process increases the stability of the production of compound wafers and makes the method more stable against small deviations during the thinning process, like geometry deviations of the wafer, deviations of the composition of the etching, deviations of the temperature, or unintended anisotropy of the thinning process.

In the present embodiment the thinning process is an isotropic thinning starting from the second side opposite to the first side 11. With reference to FIG. 1F, the thinning process starts from the bottom and the isotropic thinning leads to material removal in horizontal layers.

According to an embodiment, the semiconductor device layer 15 has a thickness including the semiconductor layer 13 between 1 µm to 600 µm, such as between 1 µm and 200 µm, or between 2 µm and 100 µm.

Figure 1G:
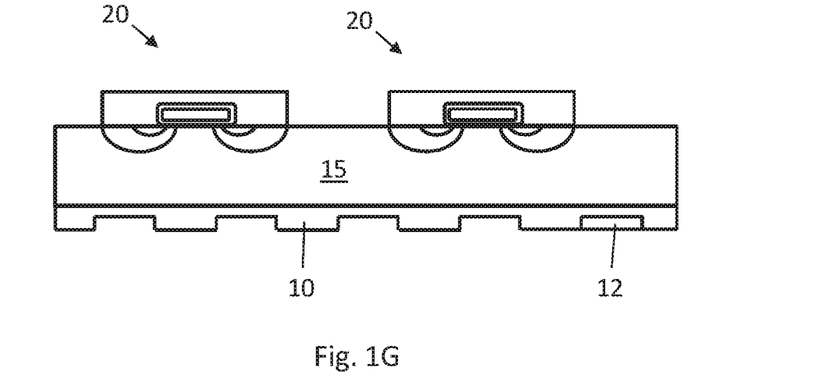

According to an embodiment, the method further includes: removing at least a portion of the dielectric islands 12 by etching after thinning the semiconductor substrate 10. As illustrated in FIG. 1G, a portion of the dielectric islands 12 can be removed after the thinning process. The dielectric islands 12 can be removed completely or partly. In particularly, dielectric islands 12 can remain in the edge regions of the wafer and/or of a semiconductor device 20.

According to an embodiment, the compound wafer includes an edge portion and a center portion, wherein removing at least a portion of the dielectric islands 12 by etching after thinning the semiconductor substrate 10 includes removing a portion of the dielectric islands 12 in the center portion and leaving at least a portion of the dielectric islands 12 in the edge portion.

Figure 1H:
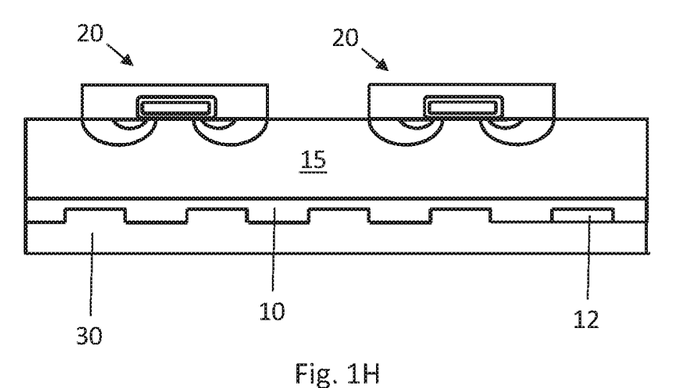
Figure 1I:
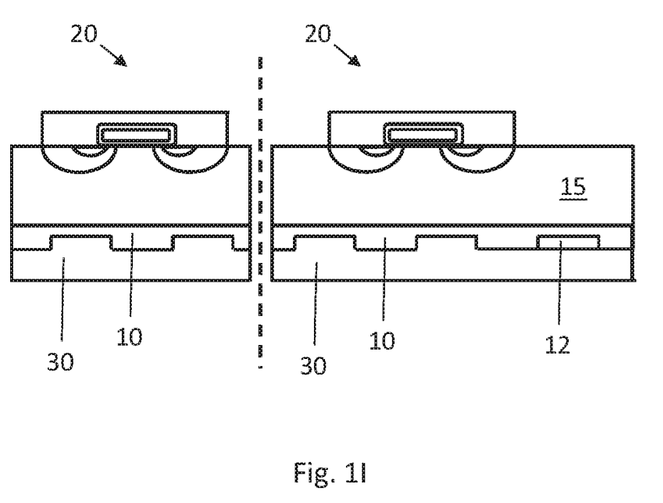

The semiconductor device layer 15 in a form of a wafer can be finally diced in semiconductor chips as illustrated in FIG. 1I. Dicing is typically carried out after fully integration of all doping regions and formation of a metallization. Dicing occurs in thickness direction.

According to an embodiment, the method further includes: forming a plurality of doping regions 21 in the substrate and/or in the semiconductor device layer 15 after removal of the dielectric islands 12 on the second side. The forming of the doping regions can be done prior to the forming of a metallization 30 and prior to the dicing of the wafer.

According to an embodiment, the method further includes: forming a metallization 30 on the second side of the semiconductor substrate 10. A backside metallization 30 can be formed on the substrate and/or on the semiconductor device layer 15 after removal of the dielectric islands 12 and prior to dicing as illustrated in FIG. 1H. In particularly, ohmic contacts may be necessary for a bipolar semiconductor device.

Alternatively, respective backside metallizations 30 can be formed after dicing on each of the semiconductor chips.

A method for manufacturing a semiconductor device is suggested. The method includes: providing a monocrystalline semiconductor substrate 10 having a first side 11 and a second side opposite the first side 11; forming a plurality of dielectric islands 12 at the first side 11 of the semiconductor substrate 10; forming an amorphous or polycrystalline semiconductor layer 13 on the first side 11 of the semiconductor substrate 10 to cover the dielectric islands 12 at the first side 11; subjecting the amorphous or polycrystalline semiconductor layer 13 to an RF-H plasma treatment; subjecting the amorphous or polycrystalline semiconductor layer to a heat treatment to convert the amorphous or polycrystalline semiconductor layer 12 into a recrystallized semiconductor layer having a monocrystalline structure adapted to a crystal structure of the semiconductor substrate; forming an epitaxial layer on the recrystallized semiconductor layer 12; forming a plurality of semiconductor devices in the epitaxial layer 15; thinning the semiconductor substrate 10 at the second side to at least partially expose the dielectric islands 12; and subsequently forming a metallization at the second side.

FIGS. 2A to 2F illustrate a process of forming a semiconductor device.

Figure 2A:
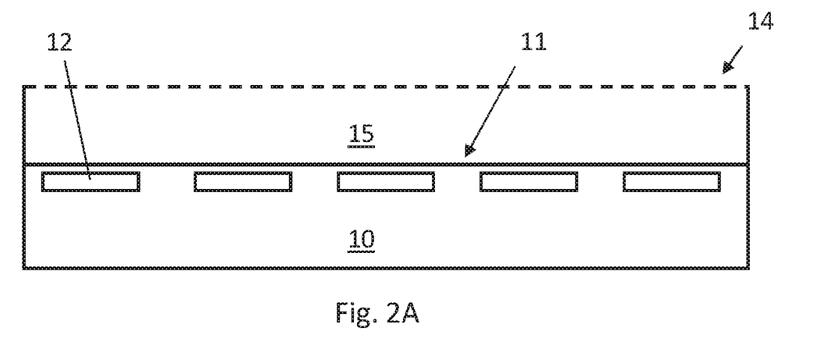
FIGS. 2A to 2F illustrate further processes according to an embodiment.

FIG. 2A illustrates a compound wafer 14 including a substrate 10 with dielectric islands 12. The compound wafer 14 further includes an epitaxial layer or semiconductor device layer 15. The dashed lines on the top of the semiconductor device layer 15 illustrate that the semiconductor device layer 15 can include front end of line and/or back end of line processed devices and/or layers, for example, a plurality of semiconductor devices, such as FETs, interconnect layers or isolation layers.

The compound wafer 14 includes a substrate 10 and buried dielectric islands 12. The compound wafer 14 provides mechanical stability during the forming of the semiconductor device layer 15 and during the front end of line and/or back end of line processing of the semiconductor device layer 15.

Figure 2B:
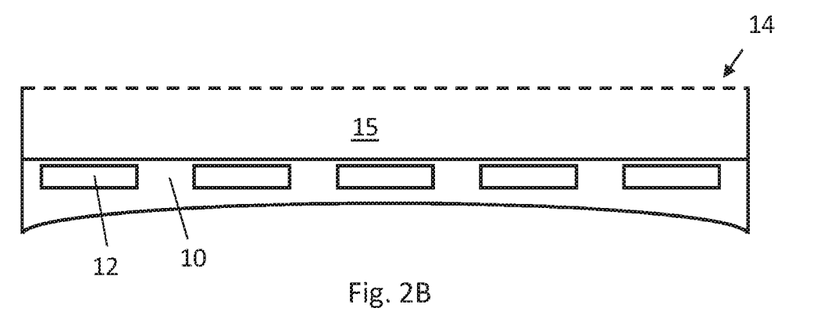
Figure 2C:
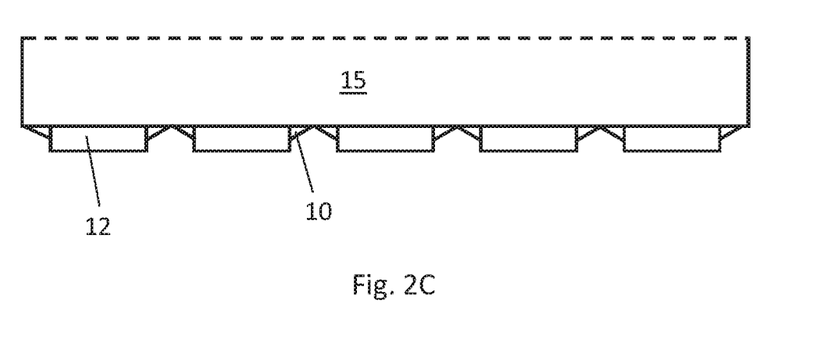

As illustrated in the embodiment of FIGS. 2B and 2C, the substrate 10 is thinned at the second side to at least partially expose the dielectric islands 12. The thinning process is an anisotropic process and the thinning process is adapted to the material of the substrate 10. The dielectric islands 12 are at least partially exposed wherein the substrate material is removed due to different chemical-mechanical stabilities. FIG. 2C further illustrates that a portion of the substrate 10 can remain on the compound wafer 14.

Figure 2D:
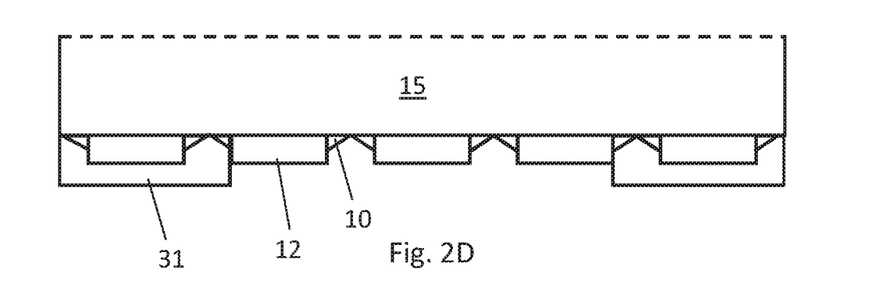
Figure 2E:
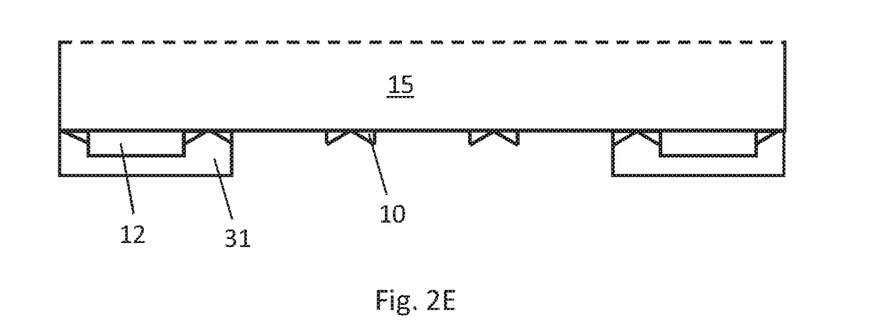
Figure 2F:
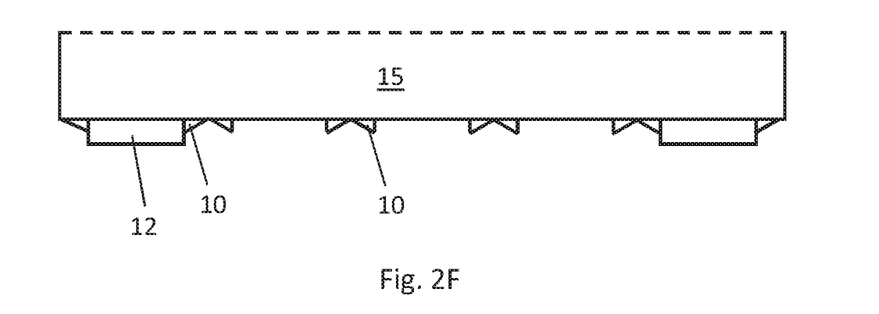

FIGS. 2D to 2F illustrates the removing of at least a portion of the dielectric islands 12. The compound wafer of the present embodiment includes an edge portion and a center portion, wherein the removing at least a portion of the dielectric islands 12 includes removing a portion of the dielectric islands 12 in the center portion and leaving at least a portion of the dielectric islands 12 in the edge portion.

According to an embodiment, the method further includes: at least partially removing the dielectric islands 12 after thinning of the semiconductor substrate 10. In FIG. 2D, the dielectric islands 12 in the edge portions are covered with a protection layer 31 prior to a removing process shown in FIG. 2E. The protection layer 31 is adapted to the process of removing the dielectric island 12. In FIG. 2F, the protection layer 31 is removed and the illustrated compound wafer includes at least a portion of the dielectric islands 12 in its edge portion.

Optionally, a metallization layer can be formed on the semiconductor device layer 15 after removal of the dielectric islands 12 in the center portion. The metallization can be formed between the remaining dielectric islands 12 or the metallization can cover at least a portion of the remaining dielectric islands 12. If a portion of the substrate 10 still remains on the semiconductor device layer 15, as illustrated in FIG. 2F, the metallization layer can cover the portion of the remaining substrate 10.

The semiconductor device layer 15 in a form of a wafer can be finally diced in semiconductor chips. Dicing is typically carried out after fully integration of all doping regions and formation of a metallization. Dicing occurs in thickness direction.

A compound wafer 14 is suggested that can be formed by a process explained above. The compound wafer 14 includes: a monocrystalline semiconductor body with having a first side and a second side; dielectric islands 12 formed at the second side of the semiconductor body; one or more doping regions 21 in the semiconductor body to for at least one pn-junction; and a metallization 30 on the second side in direct contact with the semiconductor body and the dielectric islands 12.

The semiconductor body can include for example, a substrate 10, a semiconductor layer 13 and an epitaxial layer 15 as explained above. In particularly, the semiconductor body is a monocrystalline semiconductor material, for example Si and the dielectric islands 12 include SiO.

What is claimed is:

1. A method for manufacturing a semiconductor device, the method comprising:
providing a monocrystalline semiconductor substrate having a first side;
forming a plurality of recess structures in the semiconductor substrate at the first side;
filling the recess structures with a dielectric material to form dielectric islands in the recess structures;
after filling the recess structures with the dielectric material, forming a semiconductor layer on the first side of the semiconductor substrate to cover the dielectric islands, the semiconductor layer contacting the semiconductor substrate between the dielectric islands; and
subjecting the semiconductor layer to heat treatment and recrystallizing the semiconductor layer to form a recrystallized semiconductor layer, so that a crystal structure of the recrystallized semiconductor layer adapts to a crystal structure of the semiconductor substrate, and so that the semiconductor substrate and the semiconductor layer together form a compound wafer with the dielectric islands at least partially buried in a semiconductor material of the compound wafer.

2. The method of claim 1, wherein the dielectric material is silicon oxide or silicon nitride.

3. The method of claim 1, wherein the semiconductor layer is formed as an amorphous or polycrystalline layer on and in contact with the semiconductor substrate and the dielectric islands.

4. The method of claim 1, further comprising:
subjecting the semiconductor layer to an RF-H plasma treatment.

5. The method of claim 1, further comprising:
after forming the dielectric islands and prior to forming the semiconductor layer, polishing the first side.

6. The method of claim 1, wherein subjecting the semiconductor layer to heat treatment comprises subjecting the semiconductor layer to a laser treatment of sufficient energy to cause at least a partial transformation of the crystal structure of the semiconductor layer.

7. The method of claim 1, further comprising:
forming an epitaxial layer on the semiconductor layer to increase the thickness of the compound wafer.

8. The method of claim 1, further comprising:
forming at least one pn-junction in the compound wafer.

9. The method of claim 1, further comprising:
forming a plurality of doping regions in the epitaxial layer to form a plurality of pn-junctions.

10. The method of claim 1, wherein the semiconductor layer is deposited by chemical vapor deposition or high density plasma chemical vapor deposition.

11. The method of claim 1, further comprising:
thinning the semiconductor substrate of the compound wafer on a second side opposite the first side; and
stopping the thinning at the dielectric islands.

12. The method of claim 11, further comprising:
after thinning the semiconductor substrate, removing at least a portion of the dielectric islands by etching.

13. The method of claim 12, wherein the compound wafer comprises an edge portion and a center portion, and wherein removing at least a portion of the dielectric islands by etching comprises removing a portion of the dielectric islands in the center portion and leaving at least a portion of the dielectric islands in the edge portion.

14. The method of claim 1, further comprising:
forming a metallization on a second side of the semiconductor substrate opposite the first side.

15. The method of claim 1, wherein subjecting the semiconductor layer to heat treatment comprises partially melting the semiconductor layer.

16. A method for manufacturing a semiconductor device, the method comprising:
providing a monocrystalline semiconductor substrate having a first side and a second side opposite the first side;
forming a plurality of dielectric islands at the first side of the semiconductor substrate;
after forming the plurality of dielectric islands at the first side of the semiconductor substrate, forming an amorphous or polycrystalline semiconductor layer on the first side of the semiconductor substrate to cover the dielectric islands at the first side, the amorphous or polycrystalline semiconductor layer contacting the semiconductor substrate between the dielectric islands;
subjecting the amorphous or polycrystalline semiconductor layer to an RF-H plasma treatment;
subjecting the amorphous or polycrystalline semiconductor layer to a heat treatment to convert the amorphous or polycrystalline semiconductor layer into a recrystallized semiconductor layer having a monocrystalline structure adapted to a crystal structure of the semiconductor substrate;
forming an epitaxial layer on the recrystallized semiconductor layer;
forming a plurality of semiconductor devices in the epitaxial layer;
thinning the semiconductor substrate at the second side to at least partially expose the dielectric islands; and
subsequently forming a metallization at the second side.

17. The method of claim 16, further comprising:
after thinning the semiconductor substrate at the second side, at least partially removing the dielectric islands.

* * * * *